Figure 1:
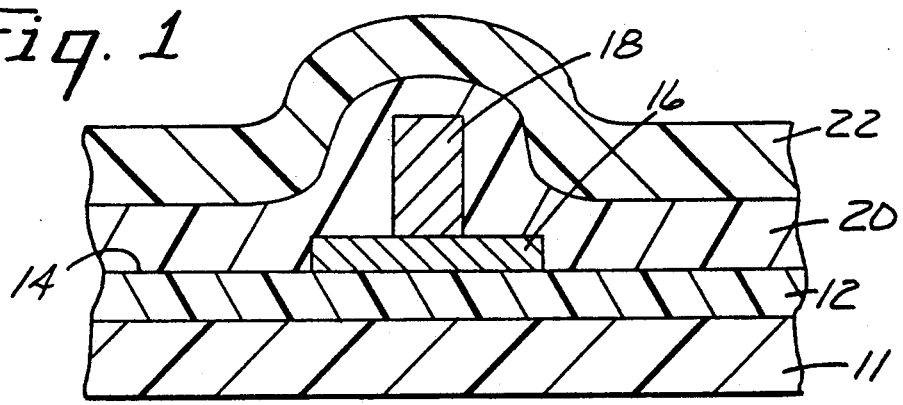

United States Patent [19]
Tingerthal et al.

[11] Patent Number: 5,102,718
[45] Date of Patent: Apr. 7, 1992

[54] MULTI-CHIP SUBSTRATE

[75] Inventors: Jeanne M. Tingerthal, White Bear Lake, Minn.; Gregory P. Dado, Madison, Wis.

[73] Assignee: Minnesota Mining and Manufacturing Company, St. Paul, Minn.

[21] Appl. No.: 562,516

[22] Filed: Jul. 27, 1990

[51] Int. Cl.$^5$ .......................... B32B 3/00; B32B 7/00; B32B 15/00
[52] U.S. Cl. .................................. 428/209; 428/195; 428/220; 428/458; 428/461; 428/419; 428/473.5; 427/96; 427/407.1
[58] Field of Search ............ 428/209, 220, 901, 411.1, 428/457, 461, 435, 473.5, 195, 458, 463, 419; 361/397, 414; 427/96, 407.1

[56] References Cited

U.S. PATENT DOCUMENTS

| 4,347,306 | 8/1982 | Takeda | 427/96 |
|---|---|---|---|
| 4,464,704 | 8/1984 | Huie | 361/414 |
| 4,508,749 | 4/1985 | Brannon | 427/96 |
| 4,594,473 | 6/1986 | Inoue | 427/96 |
| 4,681,795 | 7/1987 | Tuckerman | 428/901 |
| 4,702,792 | 10/1987 | Chow | 430/313 |
| 4,770,897 | 9/1988 | Wu | 204/192.1 |
| 4,770,899 | 9/1988 | Zeller | 427/96 |
| 4,810,332 | 3/1989 | Pan | 204/15 |
| 4,871,619 | 10/1989 | Araps | 427/96 |
| 4,937,133 | 6/1990 | Watanabe | 428/901 |

FOREIGN PATENT DOCUMENTS 129495  5/1989  Japan .................. 428/901

Primary Examiner—Ellis P. Robinson
Assistant Examiner—Nasser Ahmad
Attorney, Agent, or Firm—Gary L. Griswold; Walter N. Kirn; Darla P. Neaveill

[57] ABSTRACT

An interconnect substrate that includes a multilevel metal-polymer composite incorporating microelectronic circuitry should be economical to construct when the polymer comprises alternating layers of thermoset and thermoplastic resins, each of which is substantially free from groups that are reactive with copper. The layers of thermoset and thermoplastic resins can either alternate in adjacent levels, or each level can include both a layer of thermoset resin and a layer of thermoplastic resin. When each level includes either a thermoset resin or a thermoplastic resin, each such resin preferably has good machinability to permit each level of the interconnect to be planarized mechanically. When there is a layer of thermoset resin and a layer of thermoplastic resin in each level, the thermoplastic resin preferably is at the surface of each level, because a thermoplastic resin usually has better machinability than do thermoset resins.

21 Claims, 1 Drawing Sheet

MULTI-CHIP SUBSTRATE

BACKGROUND OF THE INVENTION

1. Field of the Invention

The invention is concerned with interconnect substrates such as a multi-chip substrate (MCS) by which a plurality of integrated chips can be interconnected into a multi-chip module (MCM).

2. Description of the Related Art

It has long been known that by mounting a plurality of integrated chips on an interconnect substrate such as an MCS, faster switching can be achieved by virtue of shorter paths between the chips. An interconnect substrate that includes a multi-level metal-polymer composite is described in Pan et al.: "A Planar Approach to High Density Copper-polyimide Interconnect Fabrication," Proceedings of the Technical Conference, Eighth Annual International Electronics Packaging Conference, Nov. 7-10, 1988, pp 174-189. The Pan publication says:

"In the MCC interconnect fabrication approach, we use pattern electroplating to plate copper to form the conductor layers and the pillar layers. These copper features are overcoated with nickel for enhanced reliability before polyimide is spin coated over the plated features to partially planarize the topography. Mechanical polishing is then carried out to fully planarize the substrate surface and expose the copper pillars. The substrate is then ready for the next layers of conductor and pillar fabrication" (Abstract, p. 174).

The polyimide employed by Pan is formed in situ from a polyamic acid, and its formulation involves the formation of water. The nickel overcoating is necessary to protect the copper features from the polyamic acid and the water that otherwise would corrode the copper. Nevertheless, Pan uses this polyimide, in part because of "its relative ease to form thick coatings and its ability to partially planarize the substrate topography" (p. 176). The final planarization is achieved by mechanical polishing.

The interconnect of the Pan publication is also the subject of U.S. Pat. No. 4,810,332 (Pan) which says that the protective overcoating can be nickel, chromium or any material that can be electroplated, describing at col. 3, lines 27-54, a series of steps for applying the protective overcoating.

Other interconnect substrates are described in U.S. Pat. No. 4,681,795 (Tuckerman); U.S. Pat. No. 4,702,792 (Chow et al.); and U.S. Pat. No. 4,770,897 (Wu). The interconnect substrate of Chow is made using a polymeric photoresist which is patterned to form openings. Conductive material is applied to fill the openings, and excess conductive material is removed by chemical-mechanical polishing to expose at least the exterior major surface of the polymeric material. The surface then has conductive features such as fine lines, patterns, and connectors surrounded by polymeric material. Preferred polymeric photoresists have a Tg of at least 150° C. and include novolaks which have been hard baked and polyimides.

The Tuckerman patent concerns the problem of planarizing the surface of each layer of a multilevel interconnect and does so by melting the metal using a pulsed laser prior to patterning. Because organics such as polyimides might be damaged by momentary exposure to the molten metal, he suggests that the dielectric be pure $SiO_2$.

The Wu patent concerns enhancing adhesion between a copper conductor and a polyimide dielectric of an interconnect substrate as well as making the copper corrosion resistant. This is done by completely sealing the copper conductor in a cured dielectric sub-layer that has been applied as two materials, both preferably photosensitive polyimides that preferably are cured in a vacuum at a temperature of about 300° or 400° C.

Although small quantities of prototype MCS's have been available from various sources for several years, there has been no large-scale production.

SUMMARY OF THE INVENTION

The present invention provides an interconnect substrate such as an MCS that is a metal-polymer composite incorporating microelectronic circuitry like that described in the Pan publication and patent but is different in construction because it has no need for the Ni or Cr protective overcoating.

The interconnect substrate of the invention, like that of Pan, has electrically conductive metal features in the form of microelectronic circuitry, but differs from that of Pan in that the polymer of the metal-polymer composite comprises alternating layers of thermoset and thermoplastic resins, each of which is substantially free from groups that are reactive with copper. Preferably, each of the thermoset resin and the thermoplastic resin is selected to have low water- absorption, thus minimizing changes in electrical properties due to changes in water content of the novel interconnect substrate.

As used herein, "electrically conductive metal features" are microelectronic circuitry. By a "thermoset resin" is meant an infusible resin that cannot be dissolved in any solvent. By "infusible" is meant that the resin does not melt when heated in an inert atmosphere. By a "thermoplastic resin" is meant a resin that is fusible and can be dissolved, even though it may be insoluble in common organic solvents, as are most polyimide resins.

Because thermoset resins cannot be dissolved, each layer of thermoplastic resin of the novel interconnect can be coated from any solvent in which it is soluble. On the other hand, the thermosetting resin (which cures to provide the above-mentioned thermoset resin) should be selected to permit it to be applied without damaging the underlying layer of thermoplastic resin. For example, when the thermosetting resin is to be applied from solution, the underlying thermoplastic resin should be resistant to the solvent.

Preferred thermoplastic resins have a Tg of at least 260° C. so that the novel interconnect substrate can resist soldering temperatures, thus permitting solder to be employed to attach microchips. Somewhat lower resistance to high temperatures is satisfactory when electrical connections are to be made without soldering, e.g., by means of die-attach conductive adhesives, but care should be taken to select the thermoplastic resin to be resistant to the highest temperature to which the novel interconnect substrate might be heated in use.

A class of thermoplastic resins that are substantially free from groups that react with copper and resist soldering temperatures is preimidized polyimides such as "Lenzing" P84 from Lenzing AG and "Matrimide" 5218 from Ciba-Geigy. Useful for the same reasons are "Ultem" 1000, a preimidized polyetherimide from General Electric, and "Victrex" PES4800P, a polyethersulfone resin available from International Chemical Industries Inc. The preimidized polyimides have excellent machinability at ordinary room temperatures as well as good toughness and flexibility. They also have significantly lower moisture absorption than do thermoplastic polyimides formed in situ from a polyamic acid.

Preferred thermosetting resins which are substantially free from groups that are reactive with copper, and when cured are resistant to soldering temperatures, include bismaleimides such as "Compimide" 896 and 183 from Boots Technochemie and "Matrimide" 5292 from Ciba-Geigy; thermosetting polyimides such as "Thermid" FA7001 from National Starch; benzocyclobutenes such as XU13005.02 from Dow Chemical; and cyanate esters such as "AroCy M50" available from Hi-Tek Polymers, Jeffersontown, Ky. When resistance to soldering temperatures is not required, epoxy resins are useful. Commercially available thermosetting resins of each of the aforementioned classes can be coated from solvents such as cyclohexanone to which preimidized polyimide thermoplastic resins are resistant. Thermosetting resins of each of those classes can be selected so that when crosslinked, they afford low moisture absorption, low dielectric constant, and good thermal and chemical resistance. Especially good in each of these respects are the bismaleimides and the cyanate esters.

Like the Pan interconnect substrate, that of the invention typically is a multilevel metal-polymer composite. In the novel interconnect substrate, layers of thermoset and thermoplastic resins can either alternate in adjacent levels, or each level can include both a layer of thermoset resin and a layer of thermoplastic resin. When each level of a multilayer interconnect substrate of the invention includes either a thermoset resin or a thermoplastic resin, each such resin preferably has good machinability to permit each level of the interconnect to be planarized mechanically, e.g., by being mechanically polished. On the other hand, when there is a layer of thermoset resin and a layer of thermoplastic resin in each level of a novel multilevel interconnect substrate, only the layer at the surface needs to be machinable. Because a thermoplastic resin usually has better machinability than do thermoset resins, the former preferably is located at the surface of each level.

In efforts to date to make a multilevel interconnect substrate having both a thermoset resin and a thermoplastic resin in each level and the thermoplastic resin at the surface, some crazing of the thermoplastic resin has been experienced in the vicinity of the Cu features. Apparently, a little of the solvent for the thermoplastic resin is penetrating through the underlying thermoset layer at the Cu features and thus reaching the next layer of thermoplastic resin.

Like Pan's interconnect substrate, that of the invention should have a durable base, preferably one that has a machinable face. Useful durable bases include a silicon wafer; ceramics such as alumina, silica, or titania; and ferrous metals such as stainless steel. A preferred base is a silicon wafer having a polymeric coating that is machinable, such as a preimidized polyimide resin, and so can be mechanically planarized to afford a smooth, planar surface on which to build a multilevel metal-polymer composite.

THE DRAWINGS

Figure 2:
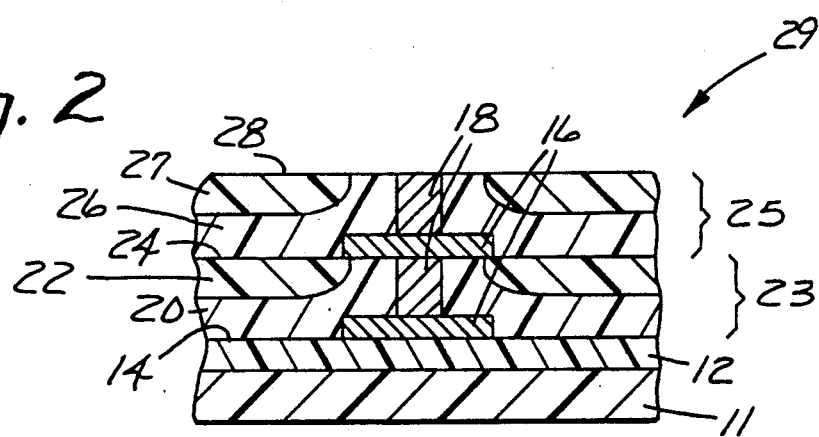
Figure 3:
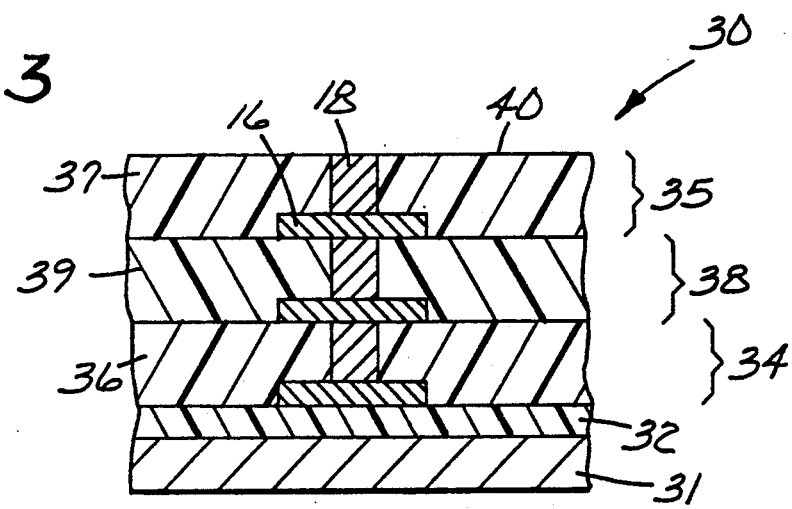

The invention may be more easily understood in reference to the drawings wherein FIG. 1 is a schematic cross-section showing an intermediate stage in the construction of a first interconnect substrate of the invention;

FIG. 2 is a schematic cross-section through the completed interconnect substrate of FIG. 1 that includes a multilevel metal-polymer composite; and FIG. 3 is a schematic cross-section through a second interconnect substrate of the invention that also includes a multilevel metal-polymer composite.

Referring first to FIG. 1, a silicon wafer 11 has a thin layer 12 of polyimide resin that has been mechanically finished to have a planar surface 14 onto which has been built by known techniques a Cu signal layer 16 and a pillar or via 18. Over this has been coated a thermosetting resin which has been crosslinked to provide a first layer 20 of thermoset resin. Over the thermoset layer 20 has been coated a second layer of thermoplastic resin that has been dried to leave a thermoplastic layer 22. This has then been mechanically planarized to provide the first level 23 of a metal-polymer composite shown in FIG. 2. In doing so, some of the Cu of via 18 has been removed.

Onto the planar surface 24 of the first level 23 has been constructed a second level 25 which (being identical in composition to the first level) includes a first layer 26 of thermoset resin and a second layer 27 of thermoplastic resin that has been mechanically planarized to a planar exterior surface 28, thus providing an interconnect substrate 29 that includes a 2-level metal-polymer composite.

In FIG. 3 is shown an interconnect substrate 30 which includes a 3-level metal-polymer composite that has Cu signal layers 16 and vias 18 and has been built on a silicon wafer 31 having a thin layer 32 of polyimide resin. The first and third levels 34, 35 are metal-polymer composites including layers 36, 37, respectively, of thermoset resin while the intermediate or second level 38 is a metal-polymer composite including a layer 39 of thermoplastic resin. If desired, additional levels with alternating layers of thermoset and thermoplastic resins could be built onto the exposed planar surface 40 of the interconnect substrate 30.

In the following examples, all parts are by weight.

EXAMPLE 1

To demonstrate the concept of building alternating layers of thermoset and thermoplastic resins, a 20% solution in N-methyl pyrrolidinone (NMP) of preimidized polyimide thermoplastic resin ("Lenzing" P84) was knife coated to a wet thickness of 0.125 mm onto a silicon wafer and dried in an oven, for 15 minutes at 140° C. followed by 30 minutes at 300° C. to provide a dry thickness of about 22 μm. Upon cooling, a 50% solution in cyclohexanone of a bismaleimide thermosetting resin ("Compimide" 183) was knife coated and subjected to the same temperature profile to dry the coating and crosslink the resin to a thermoset state at a dry thickness of about 25 μm.

Microscopic examination showed the resulting composite to have good adhesion and to be free from crazing, thus demonstrating the feasibility of building a multilevel interconnect substrate of alternating layers of thermoset and thermoplastic resins.

EXAMPLE 2

A composite was made in the same way as in Example 1 except 1) using a stainless steel base 0.1 mm in thickness without any polymeric coating, 2) building five layers of the thermoset resin alternated with four layers of the thermoplastic resin, and 3) allowing each layer to cool before covering it with the next resin layer.

Microscopic examination showed the resulting composite to have good adhesion and to be free from crazing, both before and after bending the composite around a 3-inch (7.6-cm) radius.

COMPARATIVE EXAMPLE A

A plurality of layers of the thermosetting resin of Example 1 were built on a stainless steel base identical to that of Example 2, and each layer was dried and crosslinked in the same manner as in Example 1 to a dry thickness of about 18 μm. This caused the stainless steel base to curl slightly, thus making it necessary to hold the composite flat before applying the next layer. After the seventh layer had been dried and crosslinked (total dry thickness of 0.125 mm), cracks appeared in the thermoset layers when the composite was flattened to apply to the eighth layer. Hence, the eighth layer was not applied.

Upon being bent around a 7.6-cm this composite delaminated and shattered.

COMPARATIVE TEST B

A layer of the thermoplastic resin of Example 1 was coated onto a stainless steel base identical to that of Example 2 and dried as in Example 1 to a thickness of about 25 μm. The application of a second layer of the thermoplastic resin solution crazed the underlying thermoplastic resin, so that this comparative test was discontinued.

EXAMPLE 3

A composite was made in the same manner as Example 2 except using a 55% solution in toluene of XU13005.02L benzocyclobutene from Dow Chemical, as the thermosetting resin. Microscopic examination showed the resulting composite to have good adhesion and to be free from crazing, both before and after bending the composite around a 3-inch (7.6-cm) radius.

EXAMPLE 4

A composite was made in the same manner as Example 2 except 1) using a 50% solution of toluene of "Thermid" FA7001 polyimide as the thermosetting resin, 2) building alternating layers of thermoset and thermoplastic resin until a total film thickness of 0.150-0.175 mm was obtained.

Microscopic examination showed the resulting composite to have good adhesion and to be free from crazing, both before and after bending the composite around a 3-inch (7.6-cm) radius.

EXAMPLE 5

A composite like that of Example 1 was built on a silicon wafer onto which had been sputtered a layer of chrome oxide having a thickness of 10-20 nm. Over this was spin coated a 20% NMP solution of preimidized polyimide thermoplastic resin ("Lenzing" P84). The coating was dried in an oven for 30 minutes at 55° C., 30 minutes at 140° C., and 30 minutes at 250° C. to a dry thickness of about 25 μm. After cooling, the surface of this thermoplastic resin layer was mechanically planarized to a thickness of 15 μm. This was overcoated by spin coating a 65% solution in cyclohexanone of a toughened bismaleimide thermosetting resin ("Compimide" 896) and subjected to the same temperature profile to dry the coating and crosslink the resin to a thermoset state. This coating had a dry thickness of about 25 μm and was mechanically planarized to a thickness of 15 μm.

Additional layers of the same thermoplastic and thermosetting resins were applied in the same manner to provide two layers of the thermoset resin sandwiched between three layers of the thermoplastic resin. Microscopic examination showed the resulting composite to have good adhesion and to be free from crazing.

EXAMPLE 6

A multilevel interconnect substrate like that shown in FIG. 3 can be built on a silicon wafer bearing a sputtered layer of chrome oxide 10-20 nm in thickness and a mechanically planarized layer of thermoplastic resin as in Example 5. Using an MCC 8801 mask set, onto the planarized face is built a Cu signal layer plus Cu vias using a copper pattern plate process. Over these Cu features a 65% solution in cyclohexanone of a toughened bismaleimide thermosetting resin ("Compimide" 896) is coated and heated in the same way as is Example 5. After allowing the coating to cool, the Cu features and thermoset resin are mechanically planarized to a thickness of 15 μm, thus providing a first level of metal-polymer composite. A second level of metal-polymer composite of the same thickness is built in the same manner except using a 20% NMP solution of preimidized polyimide thermoplastic resin ("Lenzing" P84). Over its planarized face is built a third level of metal-polymer composite identical in composition to the first, and the third level is mechanically planarized, thus providing interconnect substrate of the invention which includes a 3-level metal-polymer composite.

EXAMPLE 7

A composite like that of example 1 was built on a silicon wafer. A 50% MEK solution of a cyanate ester resin formulation (AroCy M50) was spin coated onto the silicon wafer and cured in an oven for 20 minutes at 55° C., 2 hours at 150° C., and 2 hours at 230° C. to a thermoset state. This coating had a dry thickness of about 25 μm. Upon cooling, a 20% solution in NMP of preimidized polyimide thermoplastic resin ("Lenzing" P84) was knife coated and subjected to the same temperature profile to dry the coating. An additional layer of thermosetting resin was applied in the same manner to provide a layer of thermoplastic resin sandwiched between two layers of thermoset resin. Microscopic examination showed the resulting composite to have good adhesion and be free from crazing.

What is claimed is:

1. An interconnect substrate comprising a metal-polymer composite incorporating microelectronic circuitry, which interconnect substrate is characterized by the feature that the polymer of said metal-polymer composite comprises alternating layers of thermoset and thermoplastic resins, said thermoplastic resins being resistant to the highest temperature to which the interconnect substrate may be heated, said thermoset resin being selected from the group consisting of bismaleimides thermosetting polyimides, benxocyclobutenes and cyanate esters, said thermoplastic resin being selected from the group consisting of preimidized polyimides, and polyethersulfones, said substrate having a durable base.

2. An interconnect substrate as defined in claim 1 wherein said metal-polymer composite is multilevel, and each level contains only one of said thermoset and thermoplastic resins.

3. An interconnect substrate as defined in claim 1 wherein said metal-polymer composite is multilevel, and each level comprises both a layer of thermoset resin and a layer of thermoplastic resin.

4. An interconnect substrate as defined in claim 3 wherein a layer of thermoplastic resin is located at the surface of each level.

5. An interconnect substrate as defined in claim 1 wherein said thermoset resin is a crosslinked bismaleimide.

6. An interconnect substrate as defined in claim 1 wherein said thermoset resin is a crosslinked cyanate ester.

7. An interconnect substrate as defined in claim 1 wherein said thermoplastic resin has a Tg of at least 260° C.

8. An interconnect substrate as defined in claim 7 wherein said thermoplastic resin comprises a polyimide.

9. An interconnect substrate as defined in claim 8 wherein said polyimide is a preimidized polyimide.

10. An interconnect substrate as defined in claim 1 wherein said metal is copper.

11. Method of producing a multilevel interconnect substrate comprising the sequential steps of:
   a) building on a durable base first electrically conductive metal features,
   b) applying over the first metal features a layer of first polymer selected from thermosetting and thermoplastic resins which are substantially free from groups that are reactive with copper,
   c) hardening said first polymer to provide a first level of metal-polymer composite,
   d) building second electrically conductive metal features on said first level,
   e) applying over the second metal features a layer of second polymer, which second polymer is the other of said thermosetting and thermoplastic resins, and
   f) hardening said second polymer to provide a second level of metal-polymer composite.

12. Method as defined in claim 11 wherein step f) is followed by the sequential steps of
   g) building third electrically conductive metal features on said second level,
   h) applying over the third metal features a layer of additional first polymer, and
   i) hardening said additional first polymer to provide a third level of metal-polymer composite.

13. Method as defined in claim 12 wherein subsequent to each hardening step is the step of planarizing the metal-polymer composite.

14. Method of producing an interconnect substrate comprising the sequential steps of:
   a) building electrically conductive metal features on a durable base,
   b) applying over the metal features a layer of first polymer selected from thermosetting and thermoplastic resins which are substantially free from groups that are reactive with copper,
   c) hardening said first polymer,
   d) applying over the layer of hardened first polymer a layer of second polymer, which second polymer is the other of said thermosetting and thermoplastic resins, and
   e) hardening said second polymer to provide a metal-polymer composite.

15. Method as defined in claim 14 wherein step e) is followed by the sequential steps of
   f) building on said metal-polymer composite second electrically conductive metal features,
   g) applying over the second metal features a second layer of first polymer,
   h) hardening said second layer of first polymer,
   i) applying over said second layer a second layer of second polymer, and
   j) hardening said second layer of second polymer to provide a two-level metal-polymer composite.

16. Method as defined in claim 15 wherein said first polymer is a thermosetting resin and said second polymer is a thermoplastic resin.

17. Method as defined in claim 16 and including between steps e) and f) and subsequent to step j) the added steps of mechanically planarizing the exposed surface of said metal-polymer composite.

18. Method as defined in claim 14 wherein said thermosetting resin is a bismaleimide.

19. Method as defined in claim 14 wherein said thermosetting resin is a cyanate ester.

20. Method as defined in claim 18 wherein said thermoplastic resin has a Tg of at least 260° C.

21. Method as defined in claim 20 wherein said thermoplastic resin comprises a preimidized polyimide.

* * * * *